(12) United States Patent
Sato et al.

(10) Patent No.: US 8,344,373 B2
(45) Date of Patent: Jan. 1, 2013

(54) THIN FILM TRANSISTOR

(75) Inventors: Ayumu Sato, Kawasaki (JP); Hideya Kumomi, Tokyo (JP); Ryo Hayashi, Yokohama (JP); Tomohiro Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 109 days.

(21) Appl. No.: 12/891,704

(22) Filed: Sep. 27, 2010

(65) Prior Publication Data

US 2011/0073856 A1   Mar. 31, 2011

Related U.S. Application Data

(63) Continuation of application No. PCT/JP2009/067021, filed on Sep. 30, 2009.

(51) Int. Cl.
*H01L 29/786* (2006.01)
*H01L 21/84* (2006.01)

(52) U.S. Cl. .................... 257/43; 257/57; 257/E21.703; 257/E29.003; 257/E29.296; 438/151

(58) Field of Classification Search .......... 257/27, 257/43, 52, 55, 57, 59, 72, 79, 98, 411, E21.46, 257/E21.461, E21.703, E27.009, E29.003, 257/E29.08, E29.145, E29.202, E29.273, 257/E29.296

See application file for complete search history.

(56) References Cited

U.S. PATENT DOCUMENTS

| 2008/0191204 | A1 | 8/2008 | Kim | |
|---|---|---|---|---|
| 2008/0237598 | A1* | 10/2008 | Nakayama | ...................... 257/59 |
| 2009/0045397 | A1 | 2/2009 | Iwasaki | |
| 2010/0073268 | A1 | 3/2010 | Matsunaga | |
| 2010/0078633 | A1 | 4/2010 | Watanabe | |

FOREIGN PATENT DOCUMENTS

| JP | 2006-165529 | * | 6/2006 |
|---|---|---|---|
| JP | 2007-103918 | A | 4/2007 |
| JP | 2007-194594 | * | 8/2007 |
| JP | 2008-199005 | A | 8/2008 |
| JP | 2008-276211 | A | 11/2008 |
| JP | 2008-283046 | A | 11/2008 |

* cited by examiner

*Primary Examiner* — Hsien Ming Lee
*Assistant Examiner* — Walter H Swanson
(74) *Attorney, Agent, or Firm* — Canon U.S.A., Inc., IP Division

(57) ABSTRACT

To achieve, in an oxide semiconductor thin layer transistor, both the stability of threshold voltage against electric stress and suppression of variation in the threshold voltage in a transfer characteristic. A thin film transistor includes an oxide semiconductor layer and a gate insulating layer disposed so as to be in contact with the oxide semiconductor layer, wherein the oxide semiconductor layer contains hydrogen atoms and includes at least two regions that function as active layers of the oxide semiconductor and have different average hydrogen concentrations in the layer thickness direction; and when the regions functioning as the active layers of the oxide semiconductor are sequentially defined as, from the side of the gate insulating layer, a first region and a second region, the average hydrogen concentration of the first region is lower than the average hydrogen concentration of the second region.

13 Claims, 12 Drawing Sheets

THIN FILM TRANSISTOR

This application is a Continuation of International Application No. PCT/JP2009/067021, filed Sep. 30, 2009, which is hereby incorporated by reference herein in its entirety.

TECHNICAL FIELD

The present invention relates to a thin film transistor including an oxide semiconductor and a method for producing such a thin film transistor.

BACKGROUND ART

At present, thin film transistors (TFTs) in which amorphous silicon or low-temperature polysilicon is used for semiconductor layers are being widely used as switching devices or driving devices in display devices such as active matrix liquid crystal display devices or organic electroluminescent (EL) devices.

However, since a high temperature process is required for producing such TFTs, it is difficult to use flexible substrates having low heat resistance such as plastic substrates or film substrates.

When amorphous silicon TFTs are used as driving devices of organic EL devices, since the field-effect mobility is low (up to 1 $cm^2V^{-1} s^{-1}$), TFTs having a large size are required and it is difficult to reduce the size of pixels. Furthermore, there is also a problem in that driving of TFTs for a long period of time causes a change in the threshold voltage of the TFTs and current passing through organic EL devices decreases.

As for low-temperature polysilicon TFTs, since correction circuits are required to overcome nonuniformity caused by an excimer laser used when crystallizing silicon, circuits become complicated. In addition, there is, for example, the following problem: since the size of a display is restricted by the radiation size of excimer laser, it is difficult to achieve a large display size.

On the other hand, in recent years, a technique of using an amorphous oxide semiconductor composed of In, Ga, Zn, and O for a channel layer of TFTs has been studied.

Oxide semiconductor TFTs are very promising as switching devices or driving devices instead of amorphous silicon TFTs or low-temperature polysilicon TFTs for display apparatuses including flexible substrates or organic EL devices.

However, oxide semiconductors containing ZnO have high sensitivity to oxygen, moisture, and the like contained in the atmosphere depending on the composition of the semiconductors and there are cases where electrical characteristics of the semiconductors change. Accordingly, to achieve stable use as thin film transistors, it is necessary to protect semiconductor layers from the atmosphere by using protective layers constituted by insulating layers.

When such protective layers are formed by a plasma chemical vapor deposition method (CVD method), a sputtering method, or the like, characteristics of TFTs are degraded by, for example, damage caused by plasma to channel layers composed of oxide semiconductors or diffusion of hydrogen from the protective layers. To avoid such degradation of characteristics, a method of suppressing degradation of characteristics of a TFT by making a channel layer composed of an oxide semiconductor have a bilayer structure and making the carrier concentration of the upper layer lower than the carrier concentration of the lower layer has been disclosed (Patent Literature 1). At this time, the carrier concentration is controlled by performing doping with a carrier acceptor such as Cu. In addition, a technique of enhancing device characteristics by making a channel layer serving as an active layer contain hydrogen in a predetermined concentration has been disclosed (Patent Literature 2).

However, when amorphous oxide semiconductor TFTs are used as driving devices of organic EL devices, the stability of the threshold voltage when driving is performed for a long period of time is not necessarily sufficient and there are cases where a circuit for correcting the threshold voltage is required. Accordingly, further enhancement of the stability against electric stress is desired.

To improve the stability of the threshold voltage against electric stress, use of oxide semiconductor channel layers having high mobility is effective. However, on the other hand, since oxide semiconductor channel layers having high mobility also have low electrical resistance, it is difficult to turn off the drain current of TFTs and variation in the threshold voltage also increases.

In summary, there is a tradeoff relationship between the stability of the threshold voltage against electric stress and variation in the threshold voltage. When one characteristic is enhanced, the other characteristic is degraded. Thus, it is difficult to achieve both of the characteristics in good states.

For example, to suppress variation in the threshold voltage while electrical resistance is low, a method of making the film thickness of a channel layer small is effective. However, when the film thickness of a channel layer is made smaller than a certain film thickness, there are cases where the stability of the threshold voltage against electric stress is degraded by the above-described damage upon the formation of the protective layer.

As one method for overcoming the tradeoff relationship, a method of making a channel layer have a bilayer structure as described in Patent Literature 1 is effective. Specifically, a thin low-resistance layer is formed as a channel layer on the gate insulating layer side and a high-resistance layer is formed as a channel layer on the protective layer side. As a result of this method, since the effective film thickness is small, variation in the threshold voltage can be suppressed to a certain degree while the stability of the threshold voltage against electric stress is maintained. However, the control of the resistance is performed in Patent Literature 1 by performing doping with a carrier acceptor such as Cu. Use of a target containing a carrier acceptor such as Cu, introduction of a gas containing a carrier acceptor, or ion implantation after film formation causes an increase in the production costs.

An object achieved by the present invention is to provide, at low cost and without using a technique of performing doping with a carrier acceptor, an oxide semiconductor TFT in which change in the threshold voltage under electric stress and variation in TFT characteristics are small.

CITATION LIST

Patent Literature

PTL 1: Japanese Patent Laid-Open No. 2008-199005
PTL 2: Japanese Patent Laid-Open No. 2007-103918

SUMMARY OF INVENTION

A thin film transistor according to the present invention includes an oxide semiconductor layer and a gate insulating layer disposed so as to be in contact with the oxide semiconductor layer, wherein the oxide semiconductor layer contains hydrogen atoms and includes at least two regions that function as active layers of the oxide semiconductor and have different average hydrogen concentrations in a layer thickness direction; and when the regions functioning as the active layers of the oxide semiconductor are sequentially defined as, from a side of the gate insulating layer, a first region and a second region, the average hydrogen concentration of the first region is lower than the average hydrogen concentration of the second region.

A method for producing a thin film transistor according to the present invention is a method for producing a thin film transistor including an oxide semiconductor layer and a gate insulating layer disposed so as to be in contact with the oxide semiconductor layer, wherein the oxide semiconductor layer at least includes, from a side of the gate insulating layer, a first region and a second region that are formed under different sputtering conditions; and a power for formation of the first region is higher than a power for formation of the second region.

Further features of the present invention will become apparent from the following description of exemplary embodiments with reference to the attached drawings.

DESCRIPTION OF EMBODIMENTS

Hereinafter, embodiments for carrying out the present invention will be described with reference to the attached drawings.

Figure 1:
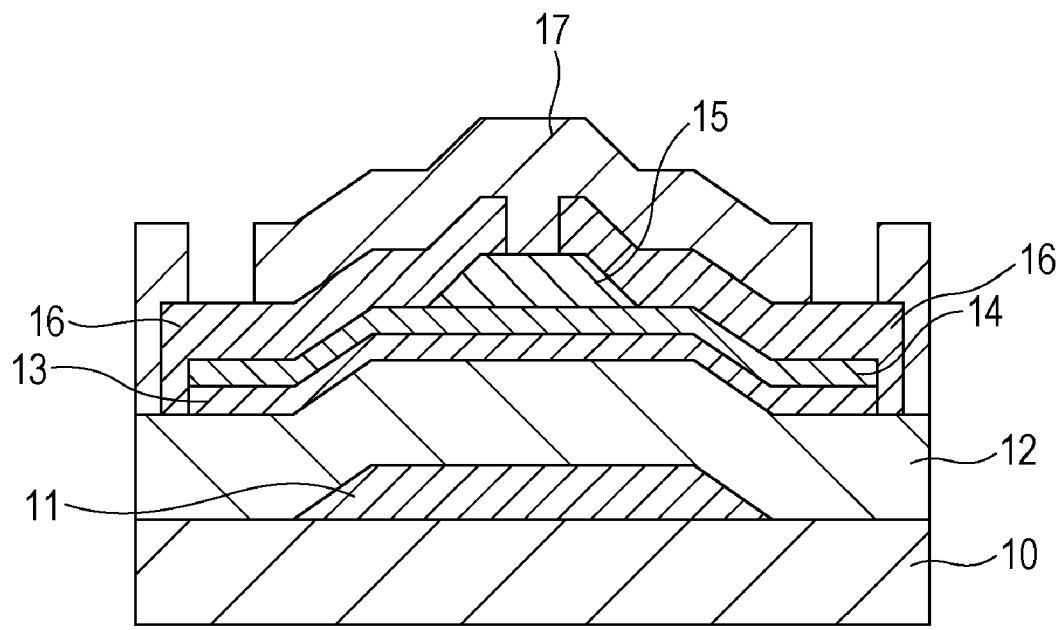
FIG. 1 is a schematic view illustrating a section of a TFT according to the present invention.

FIG. 1 is a sectional view illustrating the configuration of a bottom-gate channel-protective oxide semiconductor TFT serving as a representative example of the present invention.

The reference sign 10 denotes a substrate; the reference sign 11 denotes a gate electrode; and the reference sign 12 denotes a gate insulating layer. Sequentially from the gate insulating layer side, the reference sign 13 denotes a first oxide semiconductor region (first region); the reference sign 14 denotes a second oxide semiconductor region (second region); the reference sign 15 denotes a channel protective layer; the reference sign 16 denotes a source/drain electrode; and the reference sign 17 denotes a protective layer.

In the present invention, the first or second oxide semiconductor region (first or second region) is a region having a predetermined thickness within the oxide semiconductor layer and there may be cases where each region is present as an independent layer. In such a case, the oxide semiconductor layer has a multilayer configuration including a first layer and a second layer.

(Oxide Semiconductor Layer)

First, the oxide semiconductor layer (also referred to as an oxide semiconductor film) in the present invention will be described. The oxide semiconductor layer in the present invention functions as an active layer (channel layer) and the oxide semiconductor layer contains hydrogen atoms in a predetermined content. The manner in which hydrogen atoms are contained in the oxide semiconductor layer may be not only in the form of only hydrogen (H) but also in the form of hydroxy groups (OH groups) or water ($H_2O$). Such hydrogen contained in the oxide semiconductor layer may be in a single form or in combination of a plurality of forms. To adjust the resistivity to a high value, the amount of hydrogen contained in the form of hydroxy groups (OH groups) or water ($H_2O$) is preferably increased.

The oxide semiconductor layer can be formed by a sputtering method, a pulsed laser deposition method (PLD method), an electron beam evaporation method, or the like. When the oxide semiconductor layer is made function as a channel layer, an amorphous oxide semiconductor layer containing at least one element among In, Ga, Zn, and Sn is preferably used to enhance uniformity of characteristics in a large area.

Figure 2:
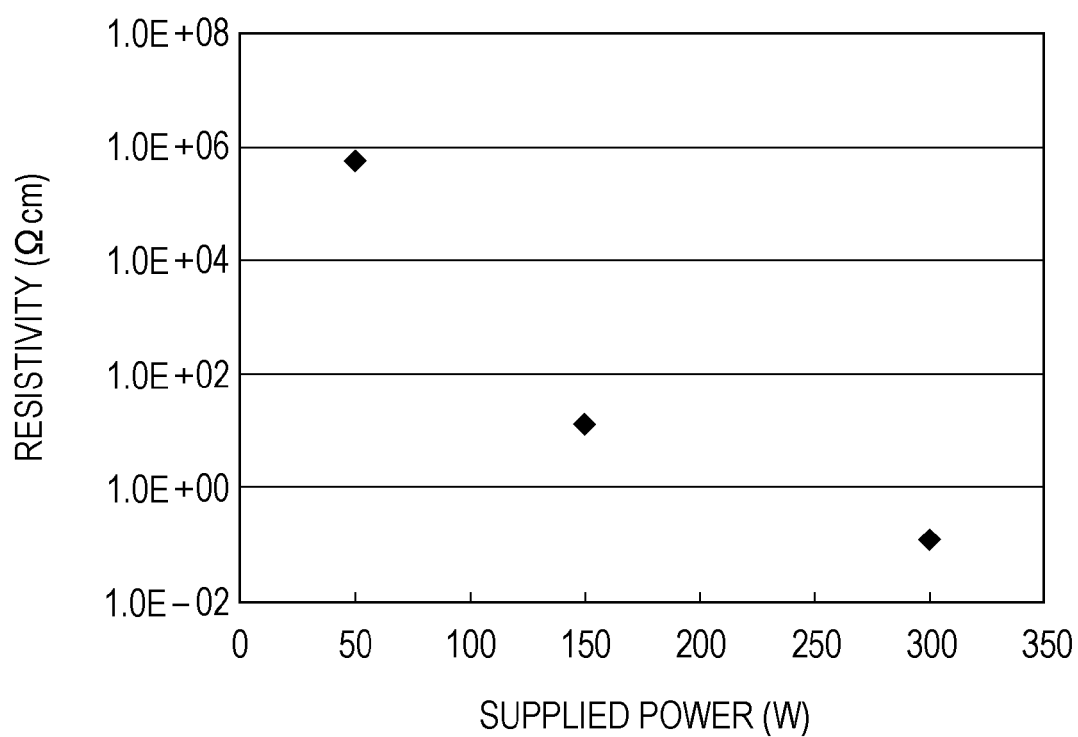
FIG. 2 illustrates the dependency of the resistivity of an amorphous IGZO oxide semiconductor layer on supplied power.

FIG. 2 illustrates the dependency of the resistivity of an amorphous In—Ga—Zn—O (IGZO) oxide semiconductor layer formed by a DC magnetron sputtering method on supplied power. The IGZO oxide semiconductor layer is formed while the substrate temperature is made at room temperature (25° C.) The formation method is preferably a sputtering method. As for an example of formation conditions (sputtering conditions), a polycrystalline sinter having a diameter of 4 inches and an $InGaZnO_4$ composition as a sputtering target; the atmosphere upon the film formation is at a total pressure of 0.5 Pa; and the gas flow rate at this time is $Ar:O_2=98:2$. The supplied power is changed in the range of 50 to 300 W. The oxide semiconductor layer has a film thickness of 30 nm. FIG. 2 shows that an oxide semiconductor film formed under the condition of a higher supplied power has a lower resistivity of the oxide semiconductor layer.

Figure 3:
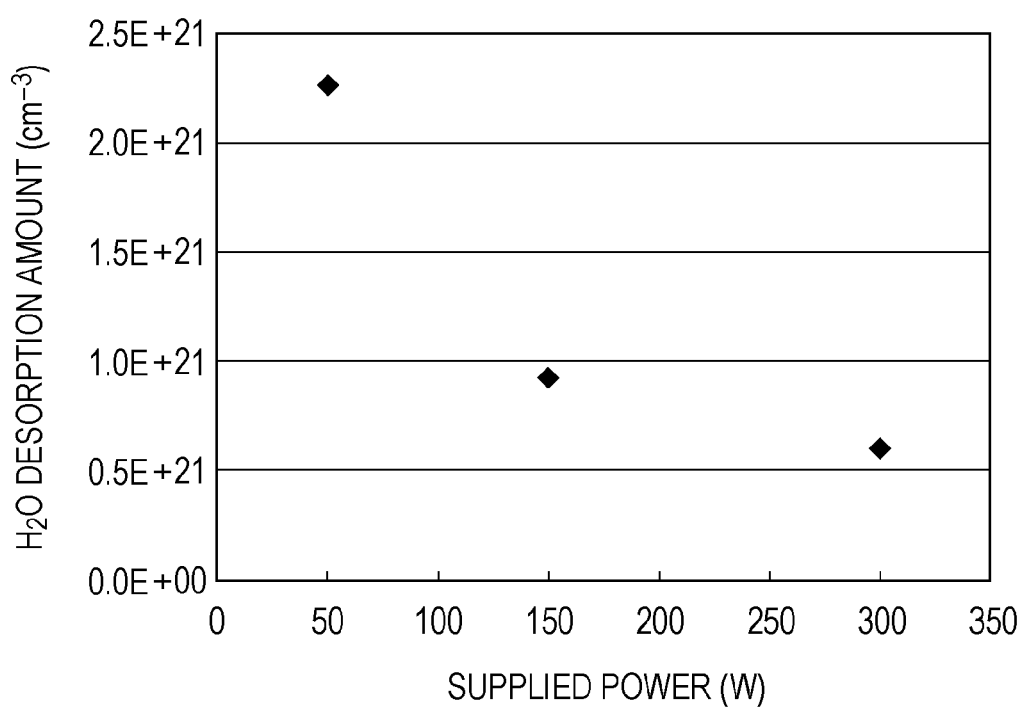
FIG. 3 illustrates the dependency of the $H_2O$ desorption amount of an amorphous IGZO oxide semiconductor layer on supplied power.

FIG. 3 illustrates the results obtained by measuring the $H_2O$ desorption amount of these films by thermal desorption spectrometry. FIG. 3 shows that an oxide semiconductor layer formed under the condition of a higher supplied power has a lower $H_2O$ desorption amount. An oxide semiconductor layer formed under the condition of a low supplied power upon the formation of the oxide semiconductor layer has a high $H_2O$ desorption amount measured by thermal desorption spectrometry. This is probably because an oxide semiconductor layer formed under the condition of a low supplied power is formed at a low film formation rate upon the formation of the oxide semiconductor layer and the oxide semiconductor layer readily incorporates therein moisture in the chamber (in the sputtering atmosphere).

The results in FIGS. 2 and 3 show that there is a correlation between the resistivity and the $H_2O$ desorption amount of an oxide semiconductor layer; and an oxide semiconductor layer having higher $H_2O$ desorption amount, that is, an oxide semiconductor layer having higher water content in the film has higher resistivity. In the present invention, water (water content) being contained in the film means that hydrogen (H) is contained in the film in the form of hydroxy groups (OH groups) or water ($H_2O$).

The resistivity of an oxide semiconductor layer correlates with the carrier concentration of the film. Accordingly, by increasing or decreasing the amount of hydrogen contained in the form of hydroxy groups (OH groups) or water ($H_2O$) in an oxide semiconductor layer, the carrier concentration of the oxide semiconductor can be adjusted.

According to findings of the inventors of the present invention, when hydrogen is present on the axis of a metal-oxygen bond or interstitially, the hydrogen functions as a donor. In contrast, when hydrogen is present in the molecular form as in a hydroxy group or water, the hydrogen does not function as a donor and hence decreases the carrier concentration of the oxide semiconductor layer and increases the resistivity of the oxide semiconductor layer. That is, the phenomena observed in FIGS. 2 and 3 show that hydrogen is present in the molecular form of hydroxy groups or water in the oxide semiconductor layers. Stated another way, the higher the concentration of hydrogen (hydrogen atoms) present in the form of hydroxy groups or water molecules in an oxide semiconductor layer is, the more the resistivity of the oxide semiconductor layer increases.

Figure 4A:
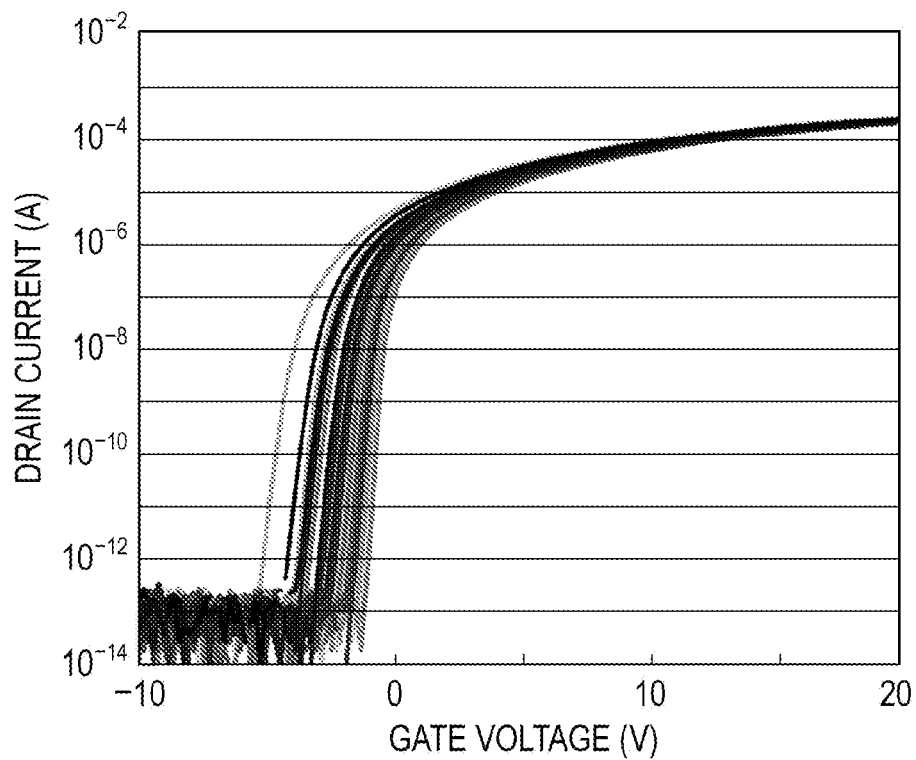
FIG. 4A illustrates the in-plane distribution of a transfer characteristic of an amorphous IGZO oxide semiconductor TFT (150 W condition).
Figure 4B:
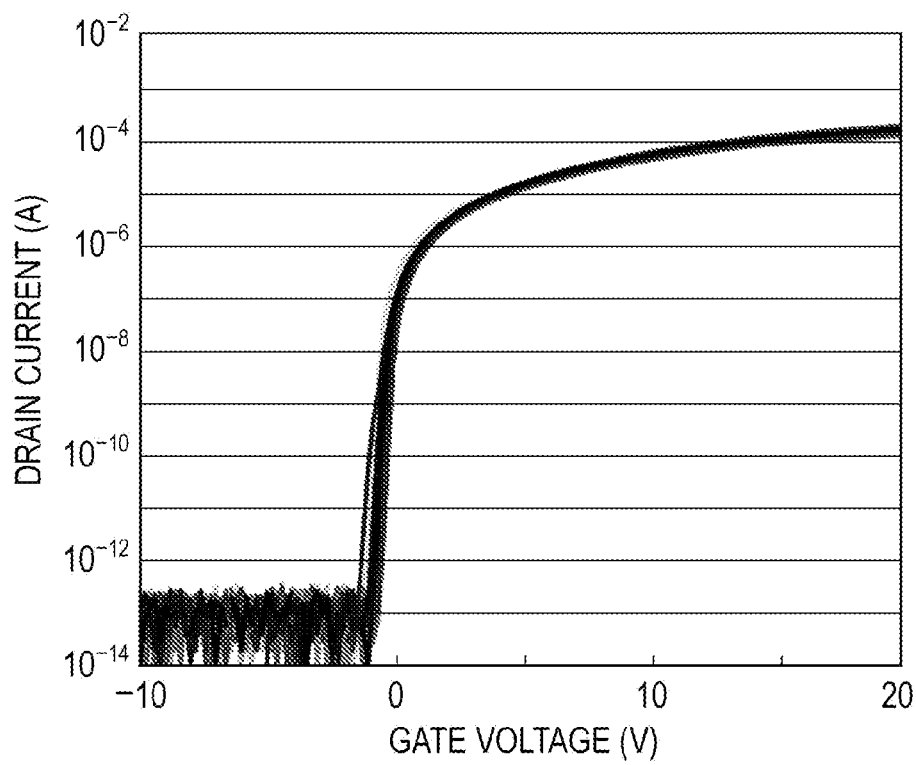
FIG. 4B illustrates the in-plane distribution of a transfer characteristic of an amorphous IGZO oxide semiconductor TFT (50 W condition).

Here, bottom-gate TFTs including, as an oxide semiconductor channel layer, an amorphous IGZO layer (30 nm) having a low resistivity and formed under the condition of the supplied power of 150 W upon sputtering and an amorphous IGZO layer (30 nm) having a high resistivity and formed under the condition of the supplied power of 50 W upon sputtering are compared in terms of characteristic. FIGS. 4A and 4B respectively illustrate a transfer characteristic of 37 points within surfaces of 4-inch substrates under the conditions of the supplied power of 150 W and 50 W upon sputtering. FIGS. 4A and 4B show that variation in the threshold voltage under the condition of the supplied power of 150 W upon sputtering is large whereas the threshold voltage under the condition of the supplied power of 50 W upon sputtering is considerably uniform. This also shows that the film under the condition of the supplied power of 50 W upon sputtering is strong against influences such as damage caused by plasma or diffusion of hydrogen from the protective layer.

Figure 5:
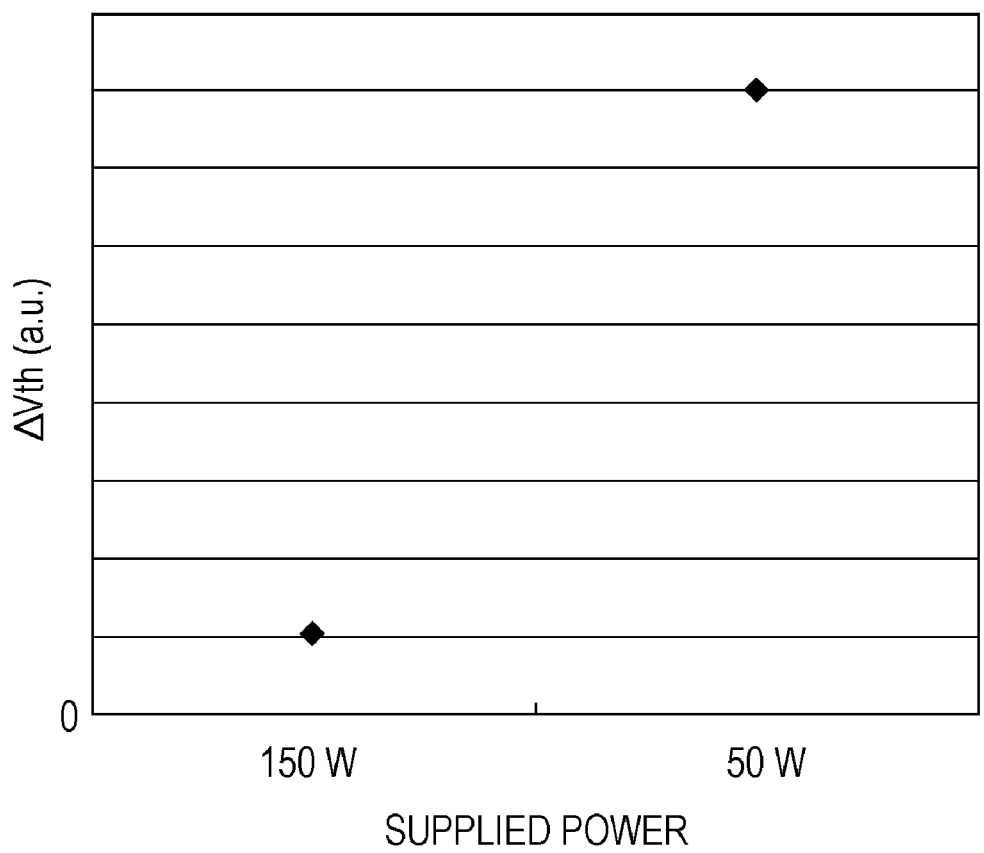
FIG. 5 illustrates comparison in a gate-bias stress test of amorphous IGZO oxide semiconductor TFTs in terms of threshold shift, $\Delta Vth$.

Next, these TFTs were subjected to a gate-bias stress test. As for the stress, a gate voltage (Vg) of 20 V was applied for 3000 seconds. A change ($\Delta$Vth) in the threshold voltage at this time is illustrated in FIG. 5. The results in FIG. 5 show that $\Delta$Vth is smaller under the condition of the supplied power of 150 W upon sputtering than in under the condition of the supplied power of 50 W upon sputtering.

Thus, the relationship between variation in the threshold voltage and the stability of the threshold voltage against electric stress is conflicting, that is, there is a tradeoff relationship.

To overcome such a tradeoff problem and to achieve good characteristics in each respect, an oxide semiconductor channel layer according to the present invention at least includes two regions having different average hydrogen concentrations in the layer thickness direction. It is preferred that, in the present invention, as to hydrogen contained in the form of hydroxy groups (OH groups) or water ($H_2O$) in the oxide semiconductor layer, there be at least two regions having different average hydrogen concentrations in the layer thickness direction.

First, the case where an oxide semiconductor layer is constituted by two semiconductor regions (bilayer configuration) in FIG. 1 will be described.

As for the first oxide semiconductor region (first region) 13, which is close to the gate insulating layer 12, a film having small water amount (low hydrogen concentration in terms of composition) and high stability of threshold voltage against electric stress is desirably used. The average concentration (the total concentration of the following two forms) of hydrogen present in the molecular form of hydroxy groups or water in the oxide semiconductor layer is desirably $1.0\times10^{21}$ atoms $cm^{-3}$ or less. There is not particularly the lower limit of the hydrogen concentration; however, the hydrogen concentration is preferably $1.0\times10^{18}$ atoms $cm^{-3}$ or more in view of ease of control in the production. The resistivity is desirably $1.0\times10^0$ $\Omega$cm or more and $1.0\times10^6$ $\Omega$cm or less. To form an oxide semiconductor layer having small water amount by a sputtering method, for example, film formation at high supplied power or high substrate temperature is effectively employed. The film thicknesses of regions having different average hydrogen concentrations are not particularly restricted; however, the film thicknesses are desirably in the range of 5 nm or more and 100 nm or less in which the film thicknesses do not influence electric stress of threshold voltage. The entire film thickness of the channel layer serving as an active layer is desirably 10 nm or more and 200 nm or less.

As for the second oxide semiconductor region (second region) 14, which is less close to the gate insulating layer 12, a film having large water amount (high hydrogen concentration in terms of composition) and being strong against influences such as damage caused by plasma or diffusion of hydrogen from the protective layer is desirably used. The concentration of hydrogen present in the molecular form of hydroxy groups or water is desirably $1.0\times10^{19}$ $cm^{-3}$ atoms or more and $1.0\times10^{22}$ atoms $cm^{-3}$ or less. The resistivity is desirably $1.0\times10^2$ $\Omega$cm or more and $1.0\times10^9$ $\Omega$cm or less.

The difference in the average hydrogen concentration between the first region and the second region having different average hydrogen concentrations is preferably two times or more and, more preferably, ten times or more. There is not particularly the upper limit of the difference in the average hydrogen concentrations between the first region and the second region; however, it is important that the hydrogen concentration and the resistivity of the layers are within the above-described ranges.

To form an oxide semiconductor region having large water amount by a sputtering method, for example, film formation at low supplied power or low substrate temperature is effectively employed. In addition, the formation may be performed while a gas containing water vapor is introduced. The film thickness of the second oxide semiconductor region 14 is not particularly restricted; however, the film thickness is preferably at least 20 nm or more so that regions of the oxide semiconductor layer formed so as to be in contact with the gate insulating layer are not suffered from influences such as damage caused by plasma or diffusion of hydrogen from the protective layer.

When the oxide semiconductor layer is constituted by three or more regions (constituted by three or more layers), the following relationship should be satisfied in at least one combination of any two regions: an oxide semiconductor region (first region) close to the gate insulating layer has lower hydrogen amount and an oxide semiconductor region (second region) less close to the gate insulating layer has higher hydrogen amount. More preferably, as to the relationship in terms of hydrogen amount, the following relationship is satisfied: as to the amount of hydrogen contained in the form of hydroxy groups (OH groups) or water ($H_2O$) in the oxide semiconductor layer, the first region has a lower hydrogen amount and the second region has a higher hydrogen amount.

The above-described water amount or hydrogen amount (hydrogen concentration) means the average concentration within a region containing the water (hydrogen contained in the form of hydroxy groups (OH groups) or $H_2O$) or hydrogen.

The water amount (hydrogen concentration in terms of composition) may be continuously or stepwise changed over a plurality of layers constituting the oxide semiconductor layer. To continuously change the water amount, the film formation should be performed while the supplied power is continuously changed or by, for example, a method in which the flow rate of a gas containing moisture is continuously changed. At this time, in at least two regions, the following relationship should be satisfied: an oxide semiconductor region (first oxide semiconductor region) close to the gate insulating layer has lower water amount (lower hydrogen amount in terms of composition) and an oxide semiconductor region (second oxide semiconductor region) less close to the gate insulating layer has higher water amount (higher hydrogen concentration in terms of composition). Accordingly, as long as this relationship is satisfied, a region having an average hydrogen concentration higher than the average hydrogen concentration of the first semiconductor region may be present between the insulating layer and the first semiconductor region. According to findings of the inventors of the present invention, a region that may be present between the gate insulating film and the first region and has higher resistivity than the first region is a region having a thickness of 30 nm or less and has a resistivity of $1.0 \times 10^2$ Ωcm or more and $1.0 \times 10^9$ Ωcm or less.

In the case where a TFT has a double gate structure and both the upper surface and the lower surface of an oxide semiconductor layer are in contact with gate insulating layers, when the oxide semiconductor layer is divided into at least three layers beginning with a region closer to the lower surface of the oxide semiconductor layer: an i region (layer), a j region (layer), and a k region (layer), the average hydrogen concentration of these regions should satisfy the following relationship: $C_i < C_j > C_k$. Alternatively, the average resistivity of these regions should satisfy the following relationship: $\rho_i < \rho_j > \rho_k$.

The closer the first semiconductor region of the present invention is to the gate insulating layer compared with the second semiconductor region of the present invention, the more preferable it is. More preferably, the first semiconductor region is in contact with the gate insulating layer. Specifically, the reason why the first region is disposed close to the gate insulating layer compared with the second region is to readily subject the first region to an electric field when an electric field is applied to the gate electrode. When there are no layers between the gate insulating film and the first region, the gate electric field most effectively influences the first region.

When the above-described configuration is employed, a layer that is thin (5 to 100 nm) and has a low resistivity ($1.0 \times 10^0$ Ωcm or more and $1.0 \times 10^6$ Ωcm or less) is formed as a channel layer (first region) closer to the gate insulating layer. A layer having a high resistivity ($1.0 \times 10^2$ Ωcm or more and $1.0 \times 10^9$ Ωcm or less) can be formed as a channel layer (second region) closer to the protective layer. The layer having a low resistivity functions as a channel layer that has a high mobility and is substantially thin (5 to 100 nm). Such a layer contains a small amount of water (hydrogen contained in the form of hydroxy groups (OH groups) or $H_2O$ in the oxide semiconductor layer) (low hydrogen concentration) and has high stability of threshold voltage against electric stress. When the layer is made function as a channel layer, variation in the threshold voltage is reduced and the stability of the threshold voltage against electric stress can be improved. On the other hand, the channel layer (second region) being closer to the protective layer and having a high resistivity contains more water (hydrogen contained in the form of hydroxy groups (OH groups) or $H_2O$ in the oxide semiconductor layer) (higher hydrogen concentration) than the first region. This layer is also strong against influences such as damage caused by plasma or diffusion of hydrogen from the protective layer. Accordingly, a change in the resistivity is small under the influences of hydrogen or damage upon the formation of the protective layer and the state of high resistivity can be maintained. Thus, the layer functions as a protective layer of a kind.

By employing such a configuration in which the first region and the second region having different functions are combined, a channel layer substantially having a bilayer configuration can be achieved. As a result, variation in the threshold voltage can be suppressed while the stability of the threshold voltage against electric stress is maintained.

In the present invention, the average hydrogen concentration of the regions of the oxide semiconductor layer can be measured by SIMS (secondary ion mass spectrometry).

The average hydrogen concentration of the regions of the oxide semiconductor layer in the present invention can be determined by determining the hydrogen concentration profile in the film thickness direction obtained by the above-described measurement method in each oxide semiconductor region and averaging these values.

To determine hydrogen present in the form of hydroxy groups or water molecules among hydrogen contained in the film, films having the same compositions (formed under the same conditions) as the oxide semiconductor regions are formed as monolayers and these films are measured in terms of $H_2O$ desorption amount by thermal desorption spectrometry. Since water molecules detected in this analysis are probably present in the form of hydroxy groups or water molecules in the films, the amount of hydrogen present in the form of hydroxy groups or water molecules in the films is seen from the $H_2O$ desorption amount to determine the amount of hydrogen present in the form in the films.

(Bottom-Gate Channel-Protective Thin Film Transistor)

The steps for producing the TFT illustrated in FIG. 1 according to the present invention are as follows.

As for the substrate 10, a glass substrate is used. Alternatively, for example, a film or a thin plate of a plastic such as polyethylene terephthalate (PET), polyethylene naphthalate (PEN), polyimide, or polycarbonate; or a stainless steel substrate coated with an insulating layer may be used.

The gate electrode 11 is subsequently formed on the substrate 10. The gate electrode layer can be formed by a sputtering method, a pulsed laser deposition method (PLD method), an electron beam evaporation method, a chemical-vapor deposition method (CVD method), or the like. The material of the electrode should have good electrical conductivity. For example, usable are a metal electrode material such as a metal (Ti, Pt, Au, Ni, Al, Mo, or the like) and an alloy of such metals; a multilayer film of such a material; or an oxide conductive material such as ITO (indium tin oxide). The gate electrode 11 is subsequently patterned by a photolithographic process, or the like.

The gate insulating layer 12 is subsequently formed on the substrate 10 having the patterned gate electrode 11. The gate insulating layer can be formed by a sputtering method, a pulsed laser deposition method (PLD method), an electron beam evaporation method, a plasma CVD method, or the like. The gate insulating material should have good insulating characteristics. For example, a silicon oxide film or a silicon nitride film formed by a PECVD method, a sputtering method, or the like can be used.

The first oxide semiconductor region (first region) 13 and the second oxide semiconductor region (second region) 14 are subsequently sequentially formed on the gate insulating layer 12. In the formation, a sputtering method, a PLD method, an electron beam evaporation method, or the like can be used. At this time, the formation is preferably performed such that the average hydrogen concentration of the first oxide semiconductor region 13 is ½ or less the average hydrogen concentration of the second oxide semiconductor region 14. That is, the average hydrogen concentration of the second oxide semiconductor region 14 is two or more times the average hydrogen concentration of the first oxide semiconductor region 13. The formation method of these is as described above. The first oxide semiconductor channel layer 13 and the second oxide semiconductor channel layer are patterned by a photolithographic process and an etching process.

A silicon oxide layer is subsequently formed as an insulating layer serving as the channel protective layer 15 on the oxide semiconductor regions 13 and 14 by a sputtering method. The channel protective layer 15 should be composed of a material (for example, $SiO_2$, SiN, $Al_2O_3$, or the like) having good insulating characteristics. Since the channel protective layer 15 is directly in contact with the second oxide semiconductor region 14, it is desirable that the channel protective layer 15 be composed of a material or formed under conditions with which the resistivity of the oxide semiconductor is not reduced upon the formation of the channel protective layer 15. Specifically, an insulating layer containing O such as silicon oxide layer or a silicon oxynitride layer is more desirable. In addition, these insulating layers may have composition that does not satisfy stoichiometry (stoichiometric composition). The channel protective layer 15 is patterned by an existing photolithographic process and an existing etching process.

The source/drain electrode 16 is subsequently formed. The source/drain electrode layer can be formed by a sputtering method, a pulsed laser deposition method (PLD method), an electron beam evaporation method, a chemical-vapor deposition method (CVD method), or the like. The material of the electrode should have good electrical conductivity. For example, usable are a metal electrode material such as a metal (Ti, Pt, Au, Ni, Al, Mo, or the like) and an alloy of such metals; a multilayer film of such a material; or an oxide conductive material such as ITO (indium tin oxide). The source/drain electrode 16 is subsequently patterned by a photolithographic process, or the like.

The protective layer 17 is further formed. The protective layer 17 should have good insulating characteristics and desirably has high barrier property against moisture and oxygen. As for the formation method, a sputtering method, a pulsed laser deposition method (PLD method), an electron beam evaporation method, a plasma CVD method, or the like can be used. Specifically, for example, a silicon nitride layer, a silicon oxide layer, a silicon oxynitride layer, a silicon carbide layer, or a multilayer film of such layers is desirable. There are no problems when the composition of such an insulating layer does not satisfy stoichiometry.

Finally, contact holes are formed in the protective layer 17 to complete a thin film transistor of the present invention. Thus, in the present invention, a plurality of the above-described transistors can be two-dimensionally arranged (arranged in rows and columns in a plane) on the substrate.

EXAMPLES

Hereinafter, examples of the present invention will be described in further detail. However, the present invention should not be considered limitative on the basis of these examples.

Example 1

An example of producing the bottom-gate channel-protective oxide semiconductor TFT including the bilayer oxide semiconductor channel layer in FIG. 1 will be described.

First, the gate electrode 11 is formed on the glass substrate 10. As for the gate electrode 11, Mo is used as an electrode material and the film thickness is made 100 nm. After that, the gate electrode layer 11 is patterned by a photolithographic process and an etching process.

Next, a 200-nm silicon oxide layer is formed as the gate insulating layer 12 by a plasma CVD method. The substrate temperature upon the formation of the silicon oxide layer by the plasma CVD method is 340° C. Processing gases used are $SiH_4$ and $N_2O$ and the proportion of the gas flow rates is $SiH_4:N_2O=1:25$. The supplied RF power density and the pressure are respectively 0.9 W/cm$^2$ and 173 Pa.

An amorphous IGZO having a film thickness of 15 nm is formed as the first oxide semiconductor region (first region) 13. This oxide semiconductor layer is formed with a DC sputtering apparatus at a substrate temperature of room temperature (25° C.). The target used is a polycrystalline sinter having an $InGaZnO_4$ composition and the supplied power is 150 W. The atmosphere upon the film formation is at a total pressure of 0.5 Pa and the gas flow rate at this time is $Ar:O_2=98:2$.

Next, the second oxide semiconductor region (second region) 14 is formed. An amorphous IGZO having a film thickness of 15 nm is formed as the second oxide semiconductor region 14. This oxide semiconductor layer is formed with a DC sputtering apparatus at a substrate temperature of room temperature (25° C.). The target used is a polycrystalline sinter having an $InGaZnO_4$ composition and the supplied power is 50 W. The atmosphere upon the film formation is at a total pressure of 0.5 Pa and the gas flow rate at this time is $Ar:O_2=98:2$. After that, patterning by a photolithographic process and an etching process is performed to form the first oxide semiconductor region 13 and the second oxide semiconductor region 14.

On this region, a silicon oxide film having a film thickness of 100 nm is formed as the channel protective layer 15 by a sputtering method. The silicon oxide layer is formed with an RF sputtering apparatus at a substrate temperature of room temperature. The target used is a $SiO_2$ target having a diameter of 4 inches and the supplied RF power is 500 W. The atmosphere upon the film formation of the silicon oxide film is at a total pressure of 0.5 Pa and the gas flow rate at this time is $Ar:O_2=90:10$. Then, patterning by a photolithographic process and an etching process is performed to form the channel protective layer 15.

Next, the source/drain electrode 16 is formed. Mo is used as an electrode material and the film thickness is made 100 nm. After that, patterning by a photolithographic process and an etching process is performed to form the source/drain electrode 16.

A silicon nitride layer having a film thickness of 300 nm is further formed as the protective layer 17 by a plasma CVD method. The substrate temperature upon the formation of the silicon nitride layer by the plasma CVD method is 250° C. Processing gases used are $SiH_4$, $NH_3$, and $N_2$ and the proportion of the gas flow rates is $SiH_4:NH_3:N_2=1:2.5:25$. The supplied RF power density and the pressure are respectively 0.9 $W/cm^2$ and 150 Pa.

To achieve electrical connection with outside, patterning by a photolithographic process and an etching process is performed to form contact holes in the protective layer 17.

Finally, an annealing treatment in the air at 250° C. for an hour with a heating furnace is performed to remove damage caused by plasma or the like.

As a result of the above-described steps, a bottom-gate channel-protective oxide semiconductor TFT according to the present invention has been completed.

Example 2

Figure 6:
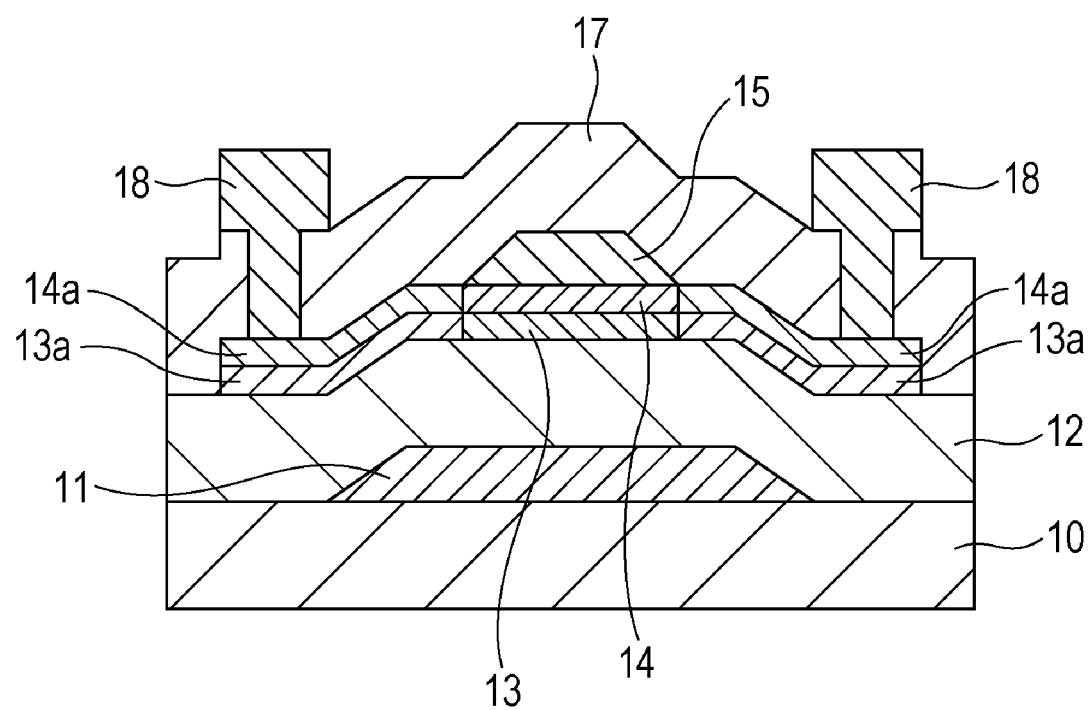
FIG. 6 is a schematic view illustrating a section of a TFT according to the present invention.

An example of producing the bottom-gate coplanar-structure oxide semiconductor TFT including a bilayer oxide semiconductor channel layer in FIG. 6 will be described.

As in EXAMPLE 1, the gate electrode 11, the gate insulating layer 12, the first oxide semiconductor channel layer 13, the second oxide semiconductor channel layer 14, and the channel protective layer 15 were formed on the glass substrate 10.

A silicon nitride layer having a film thickness of 300 nm was further formed as the protective layer 17 by a plasma CVD method. The substrate temperature upon the formation of the silicon nitride film by the plasma CVD method was 250° C. Processing gases used were $SiH_4$, $NH_3$, and $N_2$ and the proportion of the gas flow rates was $SiH_4:NH_3:N_2=1:2.5:25$. The supplied RF power density and the pressure were respectively 0.9 $W/cm^2$ and 150 Pa. Simultaneously when the protective layer 17 was formed, the regions of the oxide semiconductor regions 13 and 14 without the channel protective layer 15 were made have low resistivity by diffusion of hydrogen from the protective layer 17 to turn into source/drain regions 13a and 14a.

Contact holes were formed in the protective layer 17 by a photolithographic process and an etching process.

A source/drain wiring layer 18 was further formed by a sputtering method. The wiring material used was Mo and the film thickness was made 100 nm. After that, patterning by a photolithographic process and an etching process was performed to form the source/drain wiring layer 18.

Finally, an annealing treatment in the air at 250° C. for an hour with a heating furnace was performed to remove damage caused by dry etching or the like.

As a result of the above-described steps, a bottom-gate coplanar-structure oxide semiconductor TFT according to the present invention has been completed.

Figure 7:
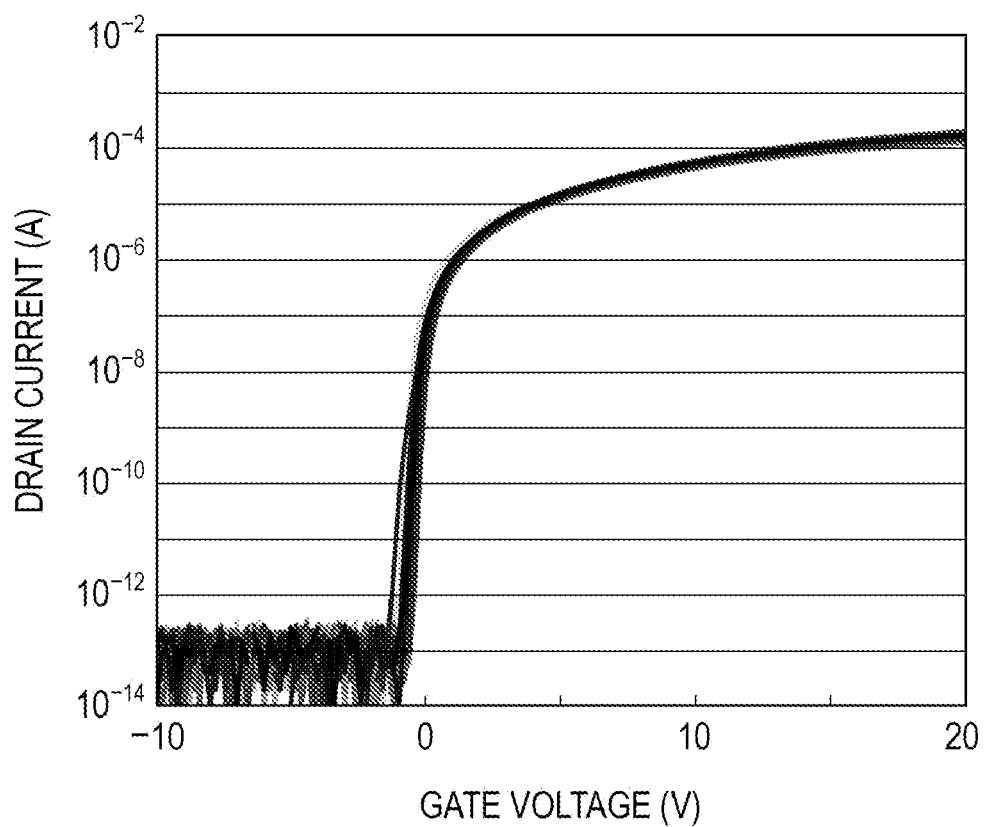
FIG. 7 illustrates the in-plane distribution of a transfer characteristic of a TFT according to the present invention.

A transfer characteristic of the oxide semiconductor TFT at 37 points of the 4-inch substrate produced by this EXAMPLE is illustrated in FIG. 7. As illustrated in FIG. 7, variation in threshold voltage is small in the oxide semiconductor TFT having a configuration according to the present invention.

Comparative Example 1

Figure 8:
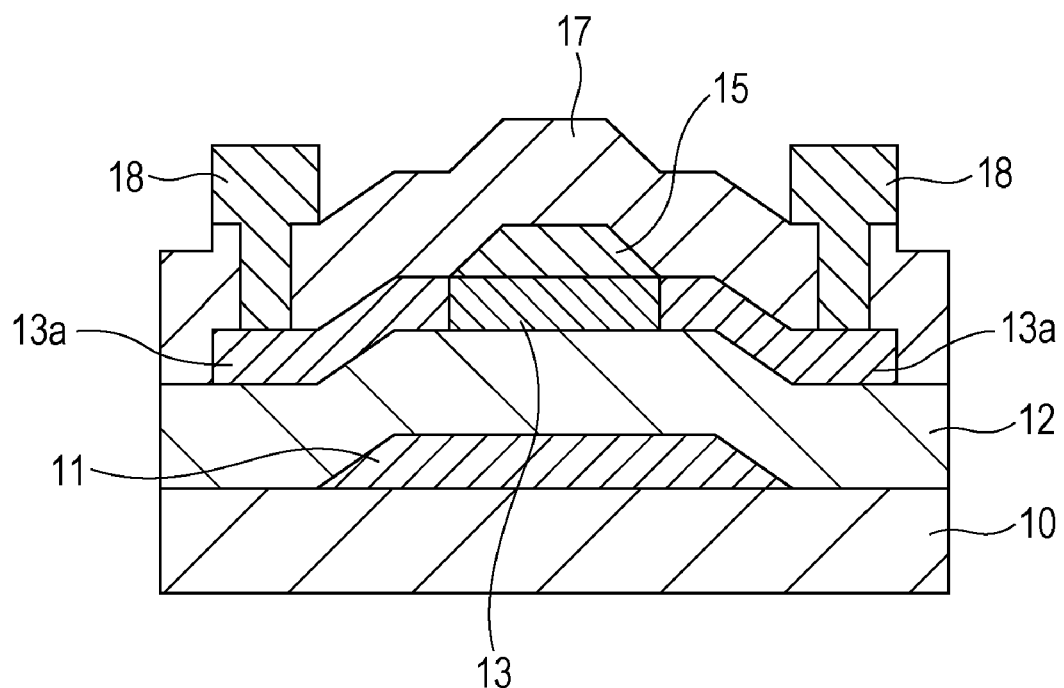
FIG. 8 is a schematic view illustrating a section of a TFT including a monolayer oxide semiconductor channel layer.

An example of producing the bottom-gate coplanar oxide semiconductor TFT including a monolayer oxide semiconductor channel layer in FIG. 8 will be described.

As in EXAMPLE 1, the gate electrode 11 and the gate insulating layer 12 were formed on the glass substrate 10.

An amorphous IGZO having a film thickness of 30 nm was formed as the oxide semiconductor channel layer 13. This oxide semiconductor layer was formed with a DC sputtering apparatus at a substrate temperature of room temperature (25° C.). The target used was a polycrystalline sinter having an $InGaZnO_4$ composition and the supplied power was 150 W. The atmosphere upon the film formation was at a total pressure of 0.5 Pa and the gas flow rate at this time was $Ar:O_2=98:2$. Then, the channel protective layer 15 was formed as in EXAMPLE 1.

As in EXAMPLE 2, the protective layer 17 was further formed. At this time, simultaneously when the protective layer 17 was formed, the region of the oxide semiconductor channel layer 13 without the channel protective layer 15 was made have low resistivity by diffusion of hydrogen from the protective layer 17 to turn into the source/drain region 13a.

As in EXAMPLE 2, contact holes and the source/drain wiring layer 18 were then formed.

Finally, an annealing treatment in the air at 250° C. for an hour with a heating furnace was performed to remove damage caused by dry etching or the like.

As a result of the above-described steps, the bottom-gate coplanar-structure oxide semiconductor TFT in which the oxide semiconductor channel layer was a monolayer was completed.

Figure 9:
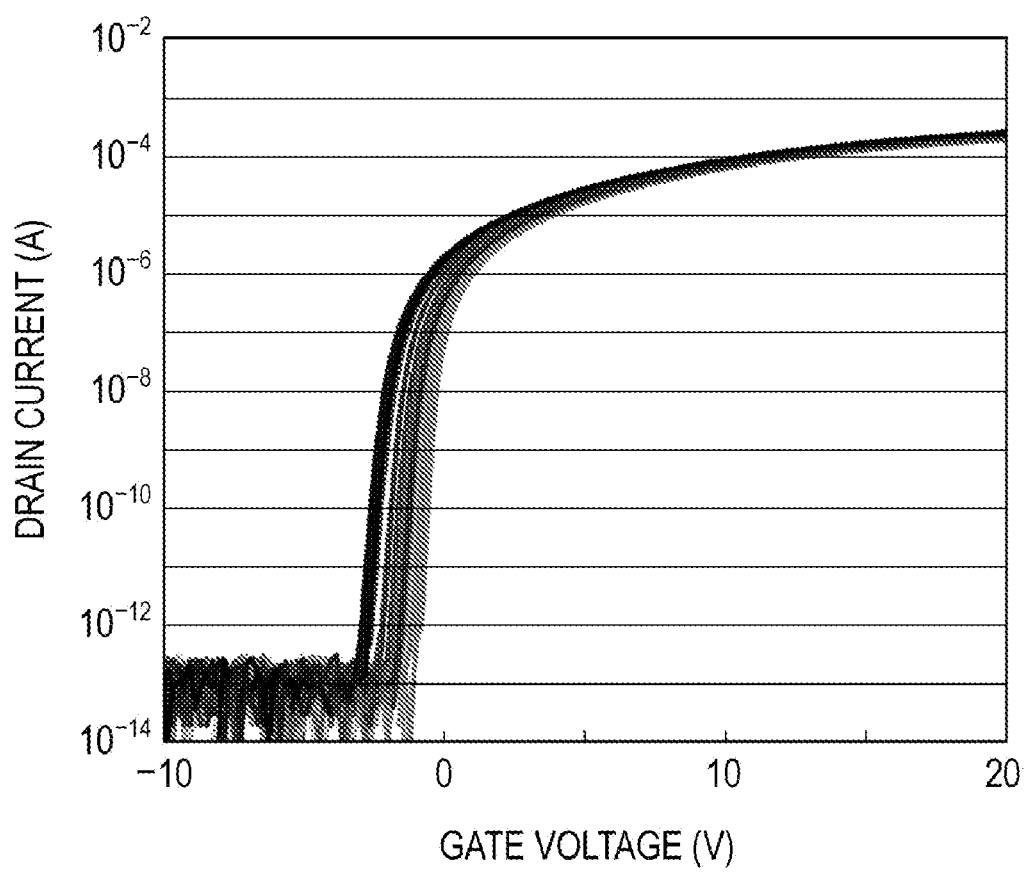
FIG. 9 illustrates the in-plane distribution of a transfer characteristic of a TFT including a monolayer oxide semiconductor channel layer.

A transfer characteristic of the oxide semiconductor TFT at 37 points in the 4-inch substrate produced by this COMPARATIVE EXAMPLE is illustrated in FIG. 9. As illustrated in FIG. 9, variation in the threshold voltage is large in the oxide semiconductor TFT including the monolayer oxide semiconductor channel layer.

Figure 10:
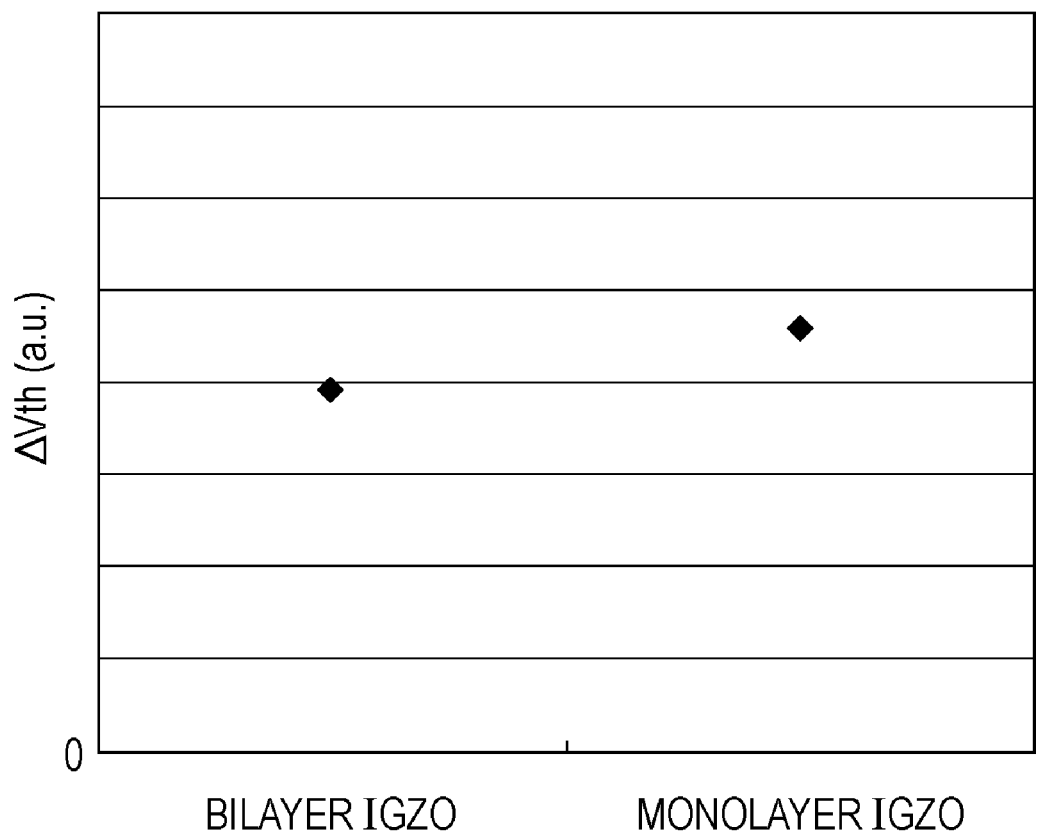
FIG. 10 illustrates the comparison between a TFT including a bilayer serving as a channel layer according to the present invention and a TFT including a monolayer serving as a channel layer, in a gate-bias stress test in terms of threshold shift, $\Delta Vth$.

Furthermore, the TFTs of EXAMPLE 2 and COMPARATIVE EXAMPLE 1 were subjected to a gate-bias stress test. As for the stress conditions, the gate bias was 20 V and the stress period was 3000 seconds. The results are illustrated in FIG. 10. FIG. 10 shows that the TFT of EXAMPLE 2 has small variation in the threshold voltage but has a $\Delta V_{th}$ amount equivalent to that of COMPARATIVE EXAMPLE 1. This shows that, in the TFT of EXAMPLE 2, uniform threshold voltage in the plane of the substrate is exhibited while $\Delta V_{th}$ equivalent to that of the TFT in which the oxide semiconductor channel layer is a monolayer is maintained. In addition, compared with the TFT described with FIG. 5 in which the resistivity is high and a monolayer amorphous IGZO layer is formed at a supplied power of 50 W, the TFT of EXAMPLE 2 has a low $\Delta V_{th}$ amount and enhanced stability while variation in the threshold voltage equivalent to that of the TFT in FIG. 5 is maintained.

Example 3

Figure 11:
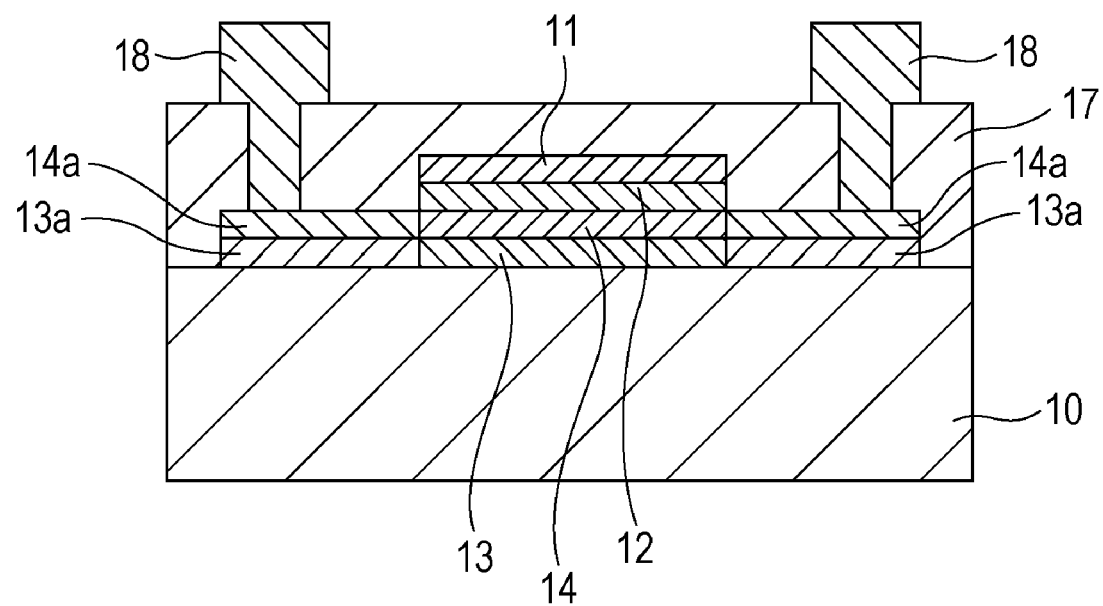
FIG. 11 is a schematic view illustrating a section of a TFT according to the present invention.

An example of producing a top-gate coplanar-structure oxide semiconductor TFT including a bilayer oxide semiconductor channel layer in FIG. 11 will be described.

First, an amorphous IGZO having a film thickness of 15 nm is formed as the second oxide semiconductor channel layer 14 on the glass substrate 10. This oxide semiconductor layer is formed with a DC sputtering apparatus at a substrate temperature of room temperature (25° C.). The target used is a polycrystalline sinter having an $InGaZnO_4$ composition and the supplied DC power is 50 W. The atmosphere upon the film formation is at a total pressure of 0.5 Pa and the gas flow rate at this time is $Ar:O_2=98:2$.

Next, an amorphous IGZO having a film thickness of 15 nm is continuously formed as the first oxide semiconductor region 13. This oxide semiconductor layer is formed with a DC sputtering apparatus at a substrate temperature of room temperature (25° C.). The target used is a polycrystalline sinter having an InGaZnO$_4$ composition and the supplied power is 150 W. The atmosphere upon the film formation is at a total pressure of 0.5 Pa and the gas flow rate at this time is Ar:O$_2$=98:2. After that, patterning by a photolithographic process and an etching process is performed to form the second oxide semiconductor region 14 and the first oxide semiconductor channel layer 13.

A silicon oxide layer having a film thickness of 100 nm is formed thereon as the gate insulating layer 12 by a sputtering method. The silicon oxide layer is formed with an RF sputtering apparatus at a substrate temperature of room temperature. The target used is a 4-inch SiO$_2$ target and the supplied RF power is 500 W. The atmosphere upon the film formation of the silicon oxide layer is at a total pressure of 0.5 Pa and the gas flow rate at this time is Ar:O$_2$=90:10.

Next, the gate electrode 11 is formed. Mo is used as an electrode material and the film thickness is made 100 nm. After that, the gate insulating layer 12 and the gate electrode layer 11 are formed by patterning by a photolithographic process and an etching process.

Furthermore, a silicon nitride layer having a film thickness of 300 nm is formed as the protective layer 17 by a plasma CVD method. The substrate temperature upon the formation of the silicon nitride layer by the plasma CVD method is 250° C. Processing gases used are SiH$_4$, NH$_3$, and N$_2$ and the proportion of the gas flow rates is SiH$_4$:NH$_3$:N$_2$=1:2.5:25. The supplied RF power density and the pressure are respectively 0.9 W/cm$^2$ and 150 Pa. Simultaneously when the protective layer 17 is formed, the regions of the oxide semiconductor channel layers 13 and 14 without the gate insulating layer 12 and the gate electrode 11 are made have low resistivity by diffusion of hydrogen from the protective layer 17 to turn into source/drain regions 13a and 14a.

Then, contact holes are formed in the protective layer 17 and the source/drain wiring layer 18 is formed by a photolithographic process and an etching process. The wiring material used is Mo and the film thickness is made 100 nm. After that, patterning by a photolithographic process and etching is performed to form the source/drain wiring layer 18.

As a result of the above-described steps, a top-gate coplanar-structure oxide semiconductor TFT according to the present invention has been completed.

Example 4

Figure 12:
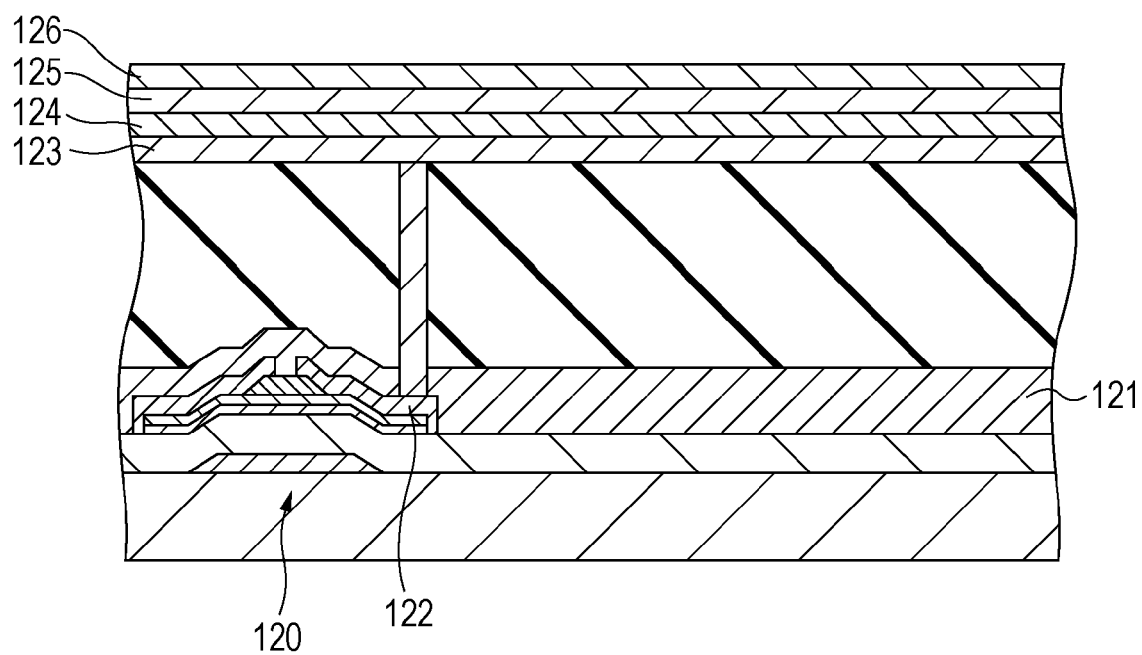
FIG. 12 is a cross sectional view of a display apparatus serving as an example according to the present invention.

In this EXAMPLE, a display apparatus in FIG. 12 including the bottom-gate channel-protective oxide semiconductor TFT illustrated in FIG. 1 will be described. The production steps of the oxide semiconductor TFT is the same as in EXAMPLE 1. However, any one of the oxide semiconductor TFTs illustrated in FIGS. 1, 6, and 11 may be used.

First, a silicon nitride layer serving as an insulating layer 121 is formed by a plasma CVD method on an oxide semiconductor TFT 120 according to the present invention. Then, contact holes are formed in the insulating layer 121 by a photolithographic process. Then, an electrode 123 is formed in a source wiring 122 with the insulating layer 121 therebetween. As for the electrode 123, ITO formed by a sputtering method is used. Next, a hole transport layer 124 and a light-emitting layer 125 are formed on the electrode 123 by a vapor deposition method. As for the hole transport layer 124 and the light-emitting layer 125, α-NPD and Alg$_3$ are respectively used. Furthermore, an electrode 126 is formed on the light-emitting layer 125 by a vapor deposition method. The electrode material used is MgAg. Thus, a display apparatus illustrated in FIG. 12 and including an organic electroluminescent device serving as a display device has been produced.

In an oxide semiconductor TFT according to the present invention, change in the threshold voltage under electric stress and variation in the threshold voltage among TFT characteristics can be reduced.

In addition, control of the hydrogen concentration (also referred to as hydrogen atom concentration) in the present invention can be performed by, for example, changing supplied power or introducing a gas containing water vapor in sputtering. Therefore, an oxide semiconductor TFT according to the present invention can be produced at low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST 10 substrate
11 gate electrode
12 gate insulating layer
13 first oxide semiconductor channel layer
13a source/drain region
14 second oxide semiconductor channel layer
14a source/drain region
15 channel protective layer
16 source/drain electrode
17 protective layer

The invention claimed is:

1. A thin film transistor comprising:
an oxide semiconductor layer comprising hydrogen atoms; and
a gate insulating layer in contact with the oxide semiconductor layer,
wherein the oxide semiconductor layer comprises at least a first region and a second region,
wherein the first region is provided between the second region and the gate insulating layer, and
wherein an average hydrogen concentration of the first region is lower than an average hydrogen concentration of the second region.

2. The thin film transistor according to claim 1, wherein the first region and the second region have a thickness of 5 nm or more and 100 nm or less; and the oxide semiconductor layer has an entire thickness of 10 nm or more and 200 nm or less.

3. The thin film transistor according to claim 1, wherein the average hydrogen concentration of the first region is $1.0 \times 10^{18}$ atoms cm$^{-3}$ or more and $1.0 \times 10^{21}$ atoms cm$^{-3}$ or less.

4. The thin film transistor according to claim 1, wherein the average hydrogen concentration of the second region is $1.0 \times 10^{19}$ atoms cm$^{-3}$ or more and $1.0 \times 10^{22}$ atoms cm$^{-3}$ or less.

5. The thin film transistor according to claim 1, wherein an average resistivity of the first region is $1.0 \times 10^{0}$ Ωcm or more and $1.0 \times 10^{6}$ Ωcm or less.

6. The thin film transistor according to claim 1, wherein an average resistivity of the second region is $1.0 \times 10^{2}$ Ωcm or more and $1.0 \times 10^{9}$ Ωcm or less.

7. The thin film transistor according to claim 1, wherein hydrogen contained in the oxide semiconductor layer is present in a form of hydroxy groups or water molecules.

8. The thin film transistor according to claim 1, wherein the oxide semiconductor layer is an amorphous oxide semiconductor layer containing at least one or more elements selected from In, Ga, Zn, and Sn.

9. The thin film transistor according to claim 1, wherein the oxide semiconductor layer functions as a channel layer.

10. The thin film transistor according to claim 1, further comprising an insulating layer in contact with the second region.

11. The thin film transistor according to claim 10, wherein the insulating layer comprises oxygen.

12. The thin film transistor according to claim 1, wherein the thin film transistor is a bottom gate transistor.

13. The thin film transistor according to claim 1, wherein the average hydrogen concentration of the second region is two or more times the average hydrogen concentration of the first region.

* * * * *